United States Patent [19]

Kosuga et al.

[11] Patent Number: 5,296,649
[45] Date of Patent: Mar. 22, 1994

[54] SOLDER-COATED PRINTED CIRCUIT BOARD AND METHOD OF MANUFACTURING THE SAME

[75] Inventors: Izumi Kosuga; Kenichi Fuse; Takao Fukunaga; Hirokazu Shiroishi, all of Tokyo; Masanao Kohno, Kakogawa; Hisao Irie, Takasago, all of Japan

[73] Assignees: The Furukawa Electric Co., Ltd., Tokyo; Harima Chemicals, Inc., Hyogo, both of Japan

[21] Appl. No.: 852,526

[22] Filed: Mar. 17, 1992

[30] Foreign Application Priority Data

Mar. 26, 1991 [JP] Japan .................. 3-84383
Mar. 26, 1991 [JP] Japan .................. 3-84384

[51] Int. Cl.⁵ .................................. H05K 01/00
[52] U.S. Cl. ................... 174/250; 174/254; 174/260; 228/180.1; 361/771
[58] Field of Search ............... 174/254, 260, 262, 263; 361/403, 404, 418; 228/180.1, 180.2

[56] References Cited

U.S. PATENT DOCUMENTS

| | | | |
|---|---|---|---|
| 3,986,255 | 10/1976 | Mandal | 174/254 X |
| 4,081,601 | 3/1978 | Dinella et al. | 174/256 |
| 4,937,006 | 6/1990 | Bickford et al. | 228/219 |
| 5,014,111 | 5/1991 | Tsuda et al. | 228/180.1 X |
| 5,118,029 | 6/1992 | Fuse et al. | 228/180.2 |
| 5,118,386 | 6/1992 | Kataoka et al. | 174/254 X |
| 5,145,532 | 8/1992 | Fukunaga et al. | 252/518 |

FOREIGN PATENT DOCUMENTS

| | | |
|---|---|---|
| 0245713 | 11/1987 | European Pat. Off. . |
| 0307888 | 3/1989 | European Pat. Off. . |
| 0430240A2 | 6/1991 | European Pat. Off. . |
| 1-157796 | 6/1989 | Japan . |

OTHER PUBLICATIONS

Technische Rundschau, vol. 79, No. 34, Aug. 21, 1987, Berb, Schweiz; pp. 62-72, Wittwer et al.; SMI: Kineswegs Nur fur Grosse.

IBM Technical Disclosure Bulletin, vol. 29, No. 9, Feb. 1987; Armonk, N.Y.; "Surface Solder Mounting Pad Geometry"; pp. 4047-4048.

Third IEEE/CHMT International Electronic Manufacturing Technology Symposium: "Manufacturing Technology-The Competitive Advantage"; Oct. 12, 1987; CA. pp. 12-15; Mizutani et al.

Patent Abstracts of Japan; vol. 15, No. 183; May 10, 1991 & JP-A-30 44 994 Feb. 26, 1991.

*Primary Examiner*—Leo P. Picard
*Assistant Examiner*—Cheryl R. Figlin
*Attorney, Agent, or Firm*—Frishauf, Holtz, Goodman & Woodward

[57] ABSTRACT

A plurality of pads are formed on a circuit board body at a pitch of 0.5 mm or less. The pads are formed such that a projecting height H of a pad from the board body surface and a width W of the pad satisfy a relation $2H < W$, that a pad array is formed in which a width of each of the pads located at two ends of the pad array is larger than that of a pad located therebetween, and that the pad width W and a pad-to-pad distance D satisfy a relation $W > D$. A solder layer, obtained by a substitution reaction between a powder of a metal having the highest ionization tendency among metals constituting the solder layer or a powder of an alloy thereof and a salt formed by bonding the other metal or metals in the solder layer to an organic acid, is formed on each pad.

15 Claims, 3 Drawing Sheets

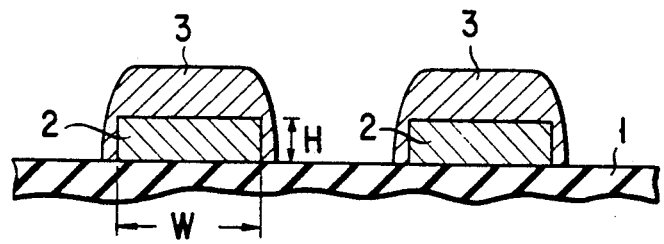
F I G. 1
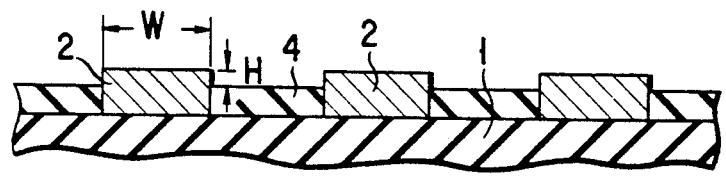
F I G. 2
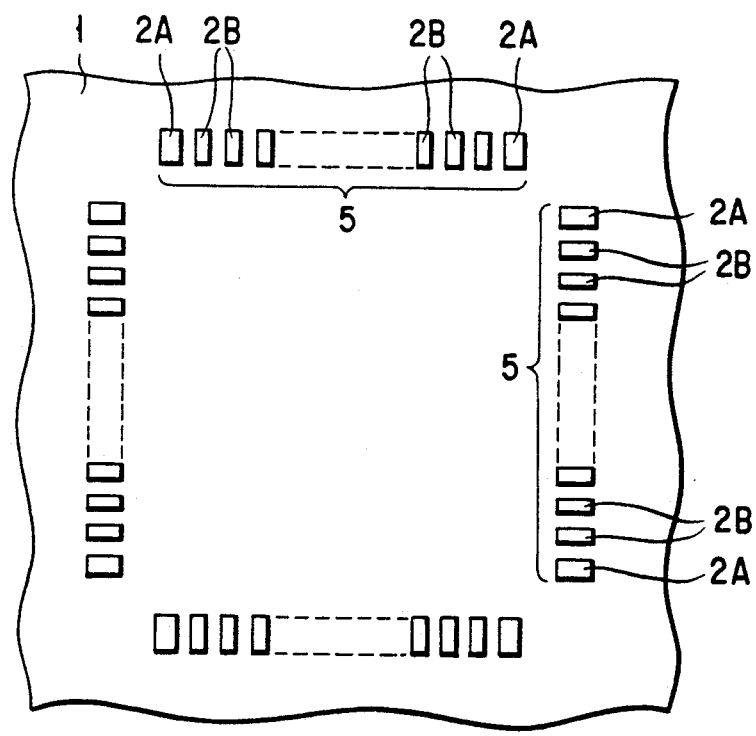
F I G. 3

SOLDER-COATED PRINTED CIRCUIT BOARD AND METHOD OF MANUFACTURING THE SAME

BACKGROUND OF THE INVENTION

1. Field of the Invention

The present invention relates to a solder-coated printed circuit board having a solder layer of a thickness necessary for soldering electronic parts leads on a pad and a method of manufacturing the same.

2. Description of the Related Art

Conventionally, to mount a surface mounting part on a printed circuit board, a solder paste is coated on a pad by means of printing, an electronic parts lead is placed on the solder paste, and the printed circuit board is heated to melt the solder paste, thereby soldering the surface mounting parts. Recently, however, as the array pitch of the parts leads is decreased, the array pitch of the pads is also decreased. When the array pitch of the pads is decreased to 0.5 mm or less, to print the solder paste becomes difficult, resulting in a frequent soldering defect such as a bridge.

As a method of mounting a fine pattern part, for example, a TAB on a printed circuit board, a so-called gang bonding method is known in which a solder layer is formed on a pad by electroplating or electroless plating, a parts lead is placed on the solder layer, and a heating jig or the like is urged against the parts lead, thereby performing soldering. This method, however, has a problem in formation of the solder layer. That is, to form a solder layer by electroplating, a current-carrying liner must be connected to each pad. It is cumbersome to connect and disconnect the current-carrying liner. To form a solder layer with a relatively large thickness, time-consuming plating must be performed. On the other hand, it is difficult to form a thick solder layer by electroless plating, and a solder layer of a thickness necessary for soldering a parts pad cannot be formed at a practical level by electroless plating.

As a method of forming a solder layer on a pad of a printed circuit board, a method is known which utilizes a substitution between, of solder alloy components, an organic acid salt (for example, a lead salt of an organic acid) of a metal having a smaller ionization tendency and a metal powder (for example, a tin powder) having a higher ionization tendency than that of the metal included above the organic acid salt (Published Unexamined Japanese Patent Application No. 1-157796). When a paste-like solder precipitating composition containing a lead salt of an organic acid and a tin powder as major components is solid-coated on a pad region on a printed circuit board and heated, a solder alloy is selectively precipitated on the pad by the substitution between the lead salt of the organic acid and the tin powder. This method utilizes the above phenomenon. According to this method, a solder layer can be formed without causing a bridge within a short period of time even if the array pitch of the pads is 0.5 mm or less.

However, since this method is to precipitate the solder on the pad by a substitution between the lead salt of the organic acid and the tin powder, the shape of the precipitated solder layer is largely influenced by the shape and dimension of the pad. For this reason, even when a solder layer having a thickness necessary for soldering a parts lead is to be formed on the pad, a large amount of the solder sometimes attaches to a side surface of the pad depending on the shape and dimension of the pad, thus making it difficult to increase the thickness of the solder layer.

In the case of a printed circuit board to be mounted with surface mounting parts of, for example, the SOP (Small Outline Package) type, the QFP (Quad Flat Package) type, and the PLCC (Plastic Leaded Chip Carrier) type which has a multiple of leads, a pad array having a multiple of pads corresponding to the parts leads is formed. When a solder layer of a thickness necessary for soldering the parts leads is to be formed on a pad array having a multiple of pads arranged at a fine pitch of 0.5 mm or less, the solder layers of the pads located at two ends of the pad array become thicker than the solder layer of the pads located at the intermediate position, thus making it difficult to form the solder layers of a uniform thickness on all the pads.

This is due to the following reason. That is, when the paste-like solder precipitating composition is solid-coated on the pad array to precipitate the solder on each pad, a step coverage is caused on the pads by the paste-like solder precipitating composition coated at a portion other than the pads. The step coverage amount is larger on pads at the two ends of the pad array than that on intermediate pads since the pad at each of the two ends of the pad array has an adjacent pad only at its one side. As a result, the thickness of the solder layer on pads at the two ends of the pad array is increased. In this manner, if the thickness of the solder layer varies in the same pad array, parts lead floating occurs during parts mounting. Then, to preliminarily fix a part on the printed circuit board becomes difficult, and an open defect in which a lead of part is not electrically contacted with a pad tends to occur.

In addition, in this method, since the paste-like solder composition is coated on the entire portion of the pad array, an economical efficiency is needed.

When a part is to be mounted on a solder-coated printed circuit board in which solder layers are pre-formed on its pads, a flux must be coated on each solder layer in order to impart good wettability of the solder to the solder surface for parts mounting. Since the flux contains an ionic substance, if the flux remains after parts soldering, the electrical insulating characteristic is degraded. For this reason, the flux must be cleaned off after parts soldering. Recently, however, use of a cleaning agent such as Freon (Tradename of DuPont de Nemours, E. I., Co.) is restricted because of environmental pollution, and an alternative to required demanded.

SUMMARY OF THE INVENTION

It is an object of the present invention to provide a solder-coated printed circuit board which has a pad array with fine pitch and in which a solder layer of a necessary thickness is formed on each pad, and a method of manufacturing the same.

It is another object of the present invention to provide a solder-coated printed circuit board which has a pad array with fine pitch and in which no variation is caused, by pads, in thickness of a solder layer of each pad array, and a method of manufacturing the same.

It is still another object of the present invention to provide a solder-coated printed circuit board which has a pad array with fine pitch and is economical, and a method of manufacturing the same.

It is still another object of the present invention to provide a solder-coated printed circuit board which does not require a flux on a solder layer of each pad for parts mounting.

First, according to the present invention, there is provided a solder-coated printed circuit board comprising a printed circuit board body, and a plurality of pads formed on a surface portion of the board body and each having a solder layer of a thickness necessary for soldering a parts lead, wherein the solder layer is formed by a substitution reaction between, a powder of a metal having the highest ionization tendency among metal constituting the solder layer or a powder of an alloy thereof and a salt formed by bonding the other metal or metals in the solder layer to an organic acid, and a projecting height H of the pad from the surface of the board body and a width W of the pad satisfy a relation $2H < W$.

Second, according to the present invention, there is provided a method of manufacturing a solder-coated printed circuit board, comprising the steps of preparing a printed circuit board body, forming a plurality of pads each satisfying a relation $2H < W$, where H is a projecting height of the pad from a board body surface and W is a width of the pad, on the board body, and forming a solder layer on each pad, the solder layer being formed by a substitution reaction between a powder of a metal having the highest ionization tendency among metals constituting the solder layer or a powder of an alloy thereof and a salt formed by bonding the other metal or metals in the solder layer to an organic acid.

Third, according to the present invention, there is provided a solder-coated printed circuit board comprising a printed circuit board body, and a plurality of pads formed on a surface portion of the board body and each having a solder layer of a thickness necessary for soldering a parts lead, wherein the solder layer is formed by a substitution reaction between a powder of a metal having the highest ionization tendency among metals constituting the solder layer or a powder of an alloy thereof and a salt formed by bonding the other metal or metals in the solder longer to an organic acid, the plurality of pads are arranged at a pitch of not more than 0.5 mm to form a pad array, and a width of each of pads located at two ends of the pad array is larger than that of a pad located therebetween.

Fourth, according to the present invention, there is provided a method of manufacturing a solder-coated printed circuit board, comprising the steps of preparing a printed circuit board body, forming a plurality of pads on the board body to form a pad array which has a pitch of not more than 0.5 mm and in which a width of each pads at two ends of the pad array is larger than that of a pad located therebetween, and forming a solder layer on each pad, the solder layer being formed by a substitution reaction between a powder of a metal having the highest ionization tendency among metals constituting the solder layer or a powder of an alloy thereof and a salt formed by bonding the other metal or metals in the solder layer to an organic acid.

Fifth according to the present invention, there is provided a solder-coated printed circuit board comprising a printed circuit board body, and a plurality of pads formed on a surface portion of the board body and each having a solder layer of a thickness necessary for soldering a parts lead, wherein the solder layer is formed by a substitution reaction between a powder of a metal having the highest ionization tendency among metals constituting the solder layer or a powder of an alloy thereof and a salt formed by bonding the other metal or metals in the solder layer to an organic acid, the plurality of pads are arranged at a pitch of not more than 0.5 mm to form a pad array, and a width W of the pad a pad-to-pad distance D satisfy a relation $W > D$.

Sixth, according to the present invention, there is provided a method of manufacturing a solder-coated printed circuit board, comprising the steps of preparing a printed circuit board body, forming a plurality of pads on the board body at a pitch of not more than 0.5 mm such that a width W of the pad and a pad-to-pad distance D satisfy a relation $W > D$, and forming a solder layer on each pad, the solder layer being formed by a substitution reaction between a powder of a metal having the highest ionization tendency among metals constituting the solder layer or a powder of an alloy thereof and a salt formed by bonding the other metal or metals in the solder layer to an organic acid.

Seventh, according to the present invention, there is provided a solder-coated printed circuit board comprising a printed circuit board body, and a plurality of pads formed on a surface portion of the board body and each having a solder layer of a thickness necessary for soldering a parts lead and a gold layer formed on the solder layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 are views for explaining the first embodiment of the present invention;

FIG. 3 is a view for explaining the second embodiment of the present invention;

DETAILED DESCRIPTION OF THE PREFERRED EMBODIMENTS

Figure 4:
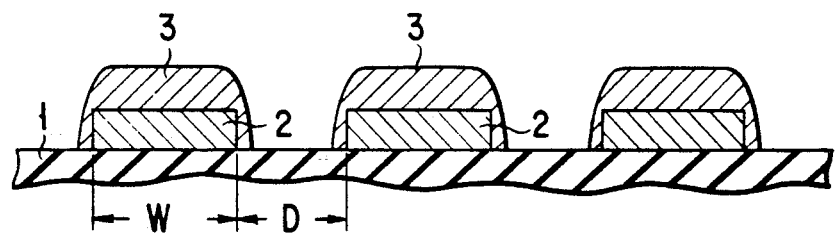
FIG. 4 is a view for explaining the third embodiment of the present invention.

The preferred embodiments of the present invention will be described.

FIG. 1 schematically shows pads of a solder-coated printed circuit board according to the first embodiment of the present invention. A plurality of pads 2 are formed on a board body 1 of an insulator by means of, for example, pattern etching of a copper foil. A solder layer 3 of a thickness necessary for electronic parts lead soldering is formed on each pad 2 in order to mount parts on the printed circuit board. The term "pad" used here is a general term for the electronic part-mounting portion, which includes, for example, the through hole to which the parts are mounted. The term "pad" hereafter is used to mean the above.

To form the solder layer 3, a solder precipitating composition disclosed in Published Unexamined Japanese Patent Application No. 1-157796 described above is used. That is, the solder layer 3 is formed by a substitution reaction between a powder of a metal having the highest ionization tendency among metals constituting the solder layer and a salt formed by bonding the other metal (having a lower ionization level than the above metal of the powder) in the solder layer to an organic acid.

A powder of a metal having the largest ionization tendency among metals constituting the solder layer and a salt formed by bonding the other metal or metals in the solder layer to an organic acid, e.g., a carboxylate, are mixed to form a paste. When the paste is coated on the pad 2 and heated, a substitution reaction takes place between the metal constituting the powder and the metal ion in the salt depending on the difference in ionization tendency. A free metal from the salt is precipitated in the form of a metal around the powder particles to form an alloy of the powder metal and the metal in the salt. For example, when a lead salt of an organic acid (e.g., a lead carboxylate, such as lead rosinate or lead acetate) is used as the salt of the organic acid and a tin powder is used as a metal powder having a large ionization tendency, an Sn-Pb solder alloy is precipitated on the pad 2 by the precipitating reaction described above.

In this embodiment, the pad 2 is formed to satisfy $2H < W$ where H is the projecting height of the pad 2 from the surface of the board body 1 and W is the width of the pad 2.

Then, the paste-like solder precipitating composition coated on and around the pad 2, which includes the lead salt of the organic acid and the tin powder as the major components is heated, and solder alloy particles are formed by the substitution reaction. When the solder alloy particles settle out in the paste toward the pad 2, a small amount of solder attaches to the side surface of the pad 2, and most of the solder attaches to the upper surface of the pad 2, thereby coating the solder layer 3 to a large thickness.

If $2H > W$, the amount of solder attached to the side surface of the pad is increased, and the amount of solder on the upper surface of the pad which is required for soldering is decreased. If a solder having an amount necessary for soldering is to be coated on the upper surface of the pad for $2H > W$, the coating amount of the paste-like solder precipitating composition must be increased, which is uneconomical. In addition, since the amount of solder attached to the side surface of the pad is also increased, bridging between pads is often caused.

The value of 2H is preferably as smaller than W as much possible. For this purpose, it is effective to coat an insulator 4, for example, a solder resist, between the adjacent pads 2, as shown in FIG. 2, thereby decreasing the projecting height H.

The second embodiment of the present invention will be described.

FIG. 3 is a plan view showing a solder-coated printed circuit board according to the second embodiment of the present invention. In this embodiment, a multiple of pads are arranged on a board body 1 at a pitch of 0.5 mm or less to form a pad array 5 (four pad arrays in FIG. 3). A solder layer is formed on each pad by a precipitating reaction as in the first embodiment (not shown in FIG. 3).

In this embodiment, as shown in FIG. 3, the width of each of pads 2A located at two ends of the pad array 5 is set larger than that of each of pads 2B located between the pads 2A.

Then, when a paste-like solder precipitating composition is solid-coated on the pad array to precipitate a solder on each pad, the amount of solder flowing to the pads located at the two ends of the pad array from the portion other than the pads is relatively decreased, since the area of each pad at the ends increases. As a result, the thickness of the solder layer precipitating on the pads at the two ends and that on the intermediate pads can be uniformed. If it were not so, the solder layers formed on the pads 2A located at the two ends are thicker than the solder layers formed on the intermediate pads 2B, since the amount of solder flowing to the pads 2A from the portion other than the pads is larger than that to the pads 2B. It is preferable that the width of each of the pads 2A at the two ends is set to about 1.2 to 2 times that of each of the intermediate pads 2B.

The third embodiment of the present invention will be described.

FIG. 4 schematically shows pad-formed portions of a solder-coated printed circuit board according to the third embodiment of the present invention. In this embodiment, a multiple of pads 2 are arranged on a board body 1 at a pitch of 0.5 mm or less. A solder layer 3 is formed on each pad 2 by a precipitating reaction as in the first embodiment.

In this embodiment, as shown in FIG. 4, the pads 2 are formed to satisfy $W > D$ where W is the width of each pad 2 and D is the pad-to-pad distance.

When the pad-to-pad distance D is set small in this manner, a solder is efficiently precipitated on each pad 2 from the paste-like solder precipitating composition coated between the pads 2, so that a thick solder layer can be formed. In addition, the amount of paste-like solder precipitating composition not contributing to precipitation of the solder is decreased, which is economical.

Note that in any of the above embodiments, to set the thickness of the solder layer uniform, it is preferable that a pad length is not excessively larger than necessary. The reason for this is as follows. When the pad length is increased, the variation in pad width along the pad lengthwise direction is increased. As a result the variation in thickness of the solder layer formed on the pad is also increased.

The fourth embodiment of the present invention will be described.

When a surface mounting part is mounted on a printed circuit board, a guide mark for confirmation of a correct position by image recognition is formed on the circuit board in order to align the position of the parts lead to that of the circuit board pad. This guide mark is conventionally provided on a side of a pad array (between outer and inner sides of the pad array). When the abovedescribed solder precipitating composition, for example, a paste-like solder precipitating composition containing a lead salt of an organic acid and a tin powder as the major components, is coated on the pad array to form a solder layer, the paste-like solder precipitating composition is solid-coated. Thus, if the guide mark is located at the position described above, the solder layer is precipitated on the guide mark as well, making it difficult to confirm the guide mark before parts mounting.

Figure 5:
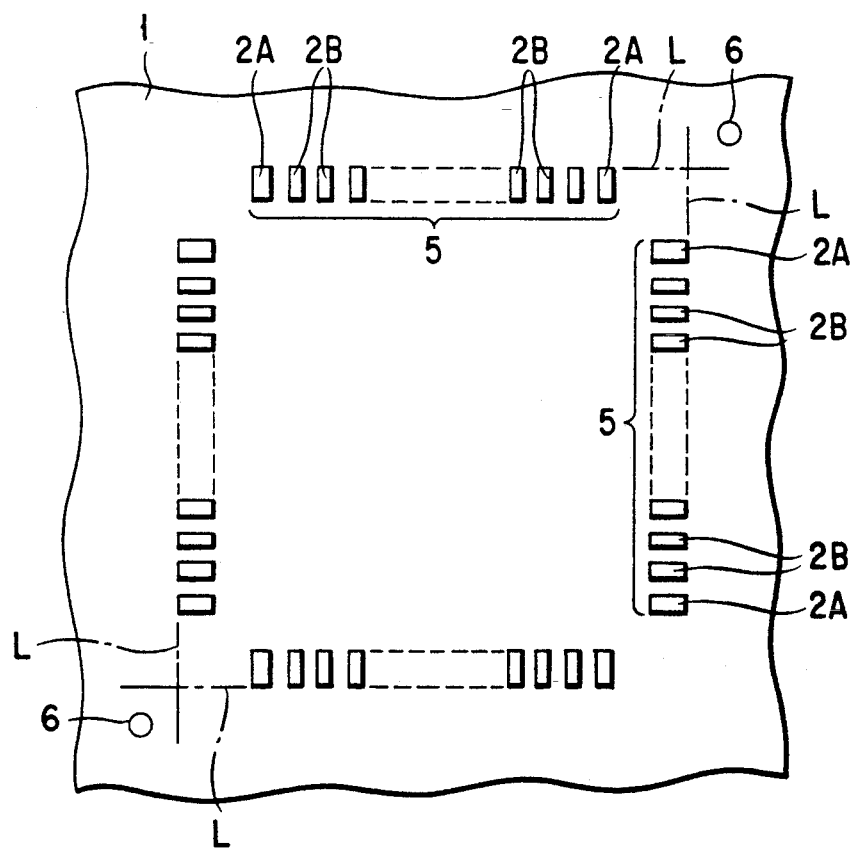
FIG. 5 is a view for explaining the fourth embodiment of the present invention.

In order to prevent this, it is preferable that a guide mark 6 for parts mounting is formed outside an outer side L of each pad array 5 consisting of a multiple of pads arranged at a predetermined pitch, as shown in FIG. 5, so that the paste-like solder precipitating composition is not coated on the guide mark 6, or the paste-like solder precipitating composition supplied to the portion other than the guide mark 6 does not precipitate on the guide mark 6.

FIG. 5 is based on FIG. 3 showing the second embodiment. It is clear that the second embodiment can also be applied to other circuit boards of other embodiments.

The fifth embodiment of the present invention will be described.

Figure 6:
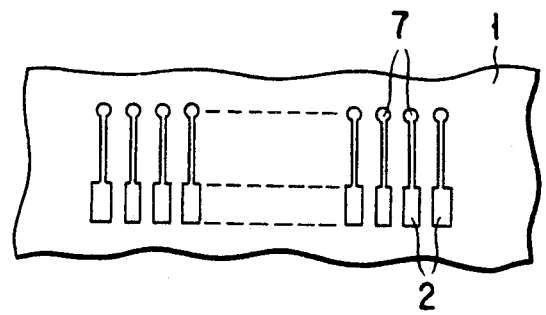
FIG. 6 is a view for explaining the fifth embodiment of the present invention.

On a solder-coated printed circuit board in which a solder layer having a thickness necessary for parts lead soldering is formed on each pad, it is preferable that an in-circuit testing pad 7 to be connected to parts leads are provided spaced apart from and connected to each pad 2, as shown in FIG. 6. With such an in-circuit testing pad 7, when a non-cleaning type flux is coated on the solder layer of the pad and a parts lead is soldered, even if the insulating flux remains on the soldered portion to block off power supply from the outside, the incircuit test can be performed using the testing pad 7.

The sixth embodiment of the present invention will be described.

Figure 7:
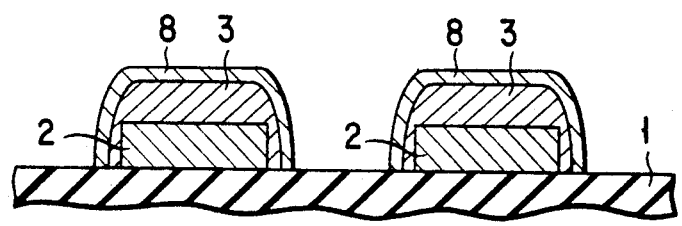
FIG. 7 is a view for explaining the sixth embodiment of the present invention.

FIG. 7 schematically shows pad-formed portions of a solder-coated printed circuit board according to the sixth embodiment of the present invention. In this embodiment, a plurality of pads 2 are formed on a board body 1 in the same manner as in the first embodiment. A solder layer 3 of a thickness necessary for parts lead soldering is formed on each pad 2 to mount a part on the printed circuit board In this embodiment, a gold layer 8 is formed on the solder layer 3. In this case, the gold layer 8 can be appropriately formed by a plating technique such as electroless plating, or by a thin film formation technique such as sputtering.

In this embodiment, the solder layer is formed by a conventional method, for example, a method of printing and heating a solder paste, a wave soldering method, a hot air leveller method, and a method of performing electroplating and heating. If the pad array pitch is less than 0.5 mm, especially 0.3 mm or less, the solder layer is preferably formed by the above-described method, that is, a method of precipitating a solder alloy by a substitution reaction between a metal salt of an organic acid (for example, a lead salt of an organic acid) having a small ionization tendency and a metal powder (for example, a tin powder) having the largest ionization tendency constituting the solder alloy.

When the gold layer 8 is formed on the solder layer 3 in this manner, oxidation of the solder layer 3 can be prevented. In addition, when a parts lead is placed on the gold layer 8 and heated, gold is diffused in the Sn or Sn-Pb plating on the surface of the parts lead, so that sufficient wettability can be obtained for the solder and the parts lead without using a flux. Also, a printed circuit board with a solder layer having a gold layer on it can be stored over a long period of time before parts mounting. A cleaning step can be omitted because a flux is not used.

In any of the embodiments described above, the solder alloy constituting the solder layer is not particularly limited, and any solder alloy which is normally used for electronic parts mounting can be used. For example, in addition to the ordinary Sn-Pb type solder, a low-melting solder containing Bi, In, Sn-Bi alloy or Sn-In alloy can be used. In these case, a Bi, In, Sn-Bi alloy or Sn-In alloy powder can be used as a powder of metal or alloy contributing to the substitution reaction.

EXAMPLE 1

A printed circuit board having a copper pad array for mounting 0.3 mm-pitch QFP-type 160-pin parts was fabricated. A projecting height H of each pad from the surface of an insulating board was set to 50 $\mu$m, a width W of each of the intermediate pads (other than the parts at the two ends) of the pad array was set to 150 $\mu$m (2H/W=0.67), and the width of each of the pads at the two ends was set to 200 $\mu$m. A paste-like solder precipitating composition containing lead salt of an organic acid and a tin powder as the major components was coated on the copper pad array to a thickness of 200 $\mu$m and heated at 215° C. for 2 minutes. Thereafter, the remainder was cleaned off with trichloroethane. When the thickness of the solder layer on the pads was measured, it was 30 $\mu$m on both the pads at the two ends and the intermediate pads. Thereafter, an RMA-based flux was coated on the solder layer and the QFP-type parts described above were mounted. The whole structure was heated to perform soldering. As a result, no defect such as bridging or lead floating occurred at all.

EXAMPLE 2

A printed circuit board having a copper pad array for mounting 0.15 mm-pitch TAB-type 250-pin parts was fabricated. A projecting height H of each pad from the surface of an insulating board was set to 18 $\mu$m, and a width W was set to 90 $\mu$m (2H/W=0.4, D/W=0.67). A paste-like solder precipitating composition containing lead salt of an organic acid and a tin powder as the major components was coated on the copper pad array to a thickness of 100 $\mu$m. When the whole structure was processed as in Example 1, a solder layer having a thickness of 15 $\mu$m was formed on each pad. Thereafter, the leads of the TAB parts were placed on the solder layers and heat pressed by a heating jig to perform gang bonding. No defect such as bridging occurred.

COMPARATIVE EXAMPLE 1

A solder layer was formed by following the same procedures as in Example 1 except that the width of each of the two pads at two ends of the copper array was set to the same as that (W=150 $\mu$m) of each intermediate pad. As a result, the thickness of the solder layer was 60 $\mu$m on the pads at the two ends and 30 $\mu$m on the intermediate pads. When a part as in Example 1 was mounted, an open defect occurred in which some leads and pads were not soldered.

COMPARATIVE EXAMPLE 2

A printed circuit board having a copper pad projecting height H of 38 $\mu$m and a width W of 60 $\mu$m (2H/W=1.3) was fabricated and processed following the same procedures as in Example 2. The thickness of the solder layer on each pad was only 4 $\mu$m. When parts were mounted on this printed circuit board and soldered, soldering failure of some leads and pads occurred.

EXAMPLE 3

A printed circuit board having a copper pad array of a pitch of 0.3 mm was fabricated. A paste-like solder precipitating composition containing a lead salt of an organic acid and a tin powder as the major components was coated on the copper pad array to a thickness of 200 μm, and the whole structure was heated at 215° C. for 2 minutes, thereby forming a solder layer to a thickness of 30 μm on each pad.

Subsequently, fats and oils in the surface of the solder layer were removed by a degreasing step, and the solder-coated printed circuit board was dipped in a gold electroless plating liquid of 80° to 90° C. for about 5 minutes, thereby forming a gold plating layer of a thickness of 0.5 to 0.8 μm on the surface of the solder layer.

Then, the whole structure was washed with water and dried sufficiently. Parts leads each having an Sn-Pb plating layer were urged against the pads each having the gold plating layer, with a heating jig. The heating temperature was 280° C., and the heating time was 3 to 5 seconds. No flux was used.

As a result, all leads were soldered to the pads with good wettability with the solder. No bridging occurred between the pads.

In order to check the long-term shelf stability, a solder-coated printed circuit board of Example 3 on which a gold plating layer was formed was washed with water and left for 1,000 hours in a thermo-hygrostat of 40° C. and 95% RH. Thereafter, the circuit board was sufficiently dried, and parts leads were soldered by following the same procedures as in Example 3. In this case, in the same manner as in Example 3, all the leads were soldered to the pads with good wettability with the solder. No bridging occurred between the pads.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solder-coated printed circuit board comprising:
   a printed circuit board body; and
   a plurality of pads formed on a surface portion of the board body and each pad having as older layer of a thickness necessary for soldering a parts lead,
   wherein the solder layer is of a type formed by a substitution reaction between (a) one of a powder of a metal having the highest ionization tendency among metals constituting the solder layer and a powder of an alloy thereof, and (b) a salt formed by bonding another metal or metals in the solder alloy to an organic acid, and wherein a projecting height H of each pad from the surface of the board body and a width W of each pad satisfy the relation $2H < W$.

2. A circuit board according to claim 1, wherein the solder layer contains an Sn-Pb alloy formed by a substitution reaction between a lead salt of an organic acid and a tin powder.

3. A circuit board according to claim 1, wherein the solder layer contains an Sn-Pb-Bi alloy formed by a substitution reaction between a lead salt of an organic acid and an Sn-Bi alloy powder.

4. A circuit board according to claim 1, wherein the solder layer contains an Sn-Pb-In alloy formed by a subsitutution reaction between a lead salt of an organic acid and an Sn-In alloy powder.

5. A method of manufacturing a solder-coated printed circuit board, comprising the steps of:
   preparing a printed circuit board body;
   forming a plurality of pads each satisfying a relation $2H < W$, where H is a projecting height of each pad from a board body surface and W is a width of each pad, on the board body; and
   forming a solder layer on each pad, the solder layer being formed by a substitution between (a) one of a powder of a metal having the highest ionization tendency among metals constituting the solder layer and a powder of an alloy thereof, and (b) a salt formed by bonding another metal or metals in the solder layer to an organic acid.

6. A solder-coated printed circuit board comprising:
   a printed circuit board body; and
   a plurality of pads formed on a surface portion of the board body and each pad having a solder layer of a thickness necessary for soldering a parts lead,
   wherein the solder layer is of a type formed by a substitution reaction between (a) one of a powder of a metal having the highest ionization tendency among metals constituting the solder layer and a powder of an alloy thereof, and (b) a salt formed by bonding another metal or metals in the solder layer to an organic acid, the plurality of pads being arranged at a pitch of not more than 0.5 mm to form a pad array, and wherein a width of each of said pads located at two ends of the pad array is larger than that of a pad located therebetween.

7. A circuit board according to claim 6, wherein the solder layer contains an Sn-Pb alloy formed by a substitution reaction between a lead salt of an organic acid and a tin powder.

8. A circuit board according to claim 6, wherein the solder layer contains an Sn-Pb-Bi alloy formed by a substitution reaction between a lead salt of an organic acid and an Sn-Bi alloy powder.

9. A circuit board according to claim 6, wherein the solder layer contains an Sn-Pb-In alloy formed by a substitution reaction between a lead salt of an organic acid and an Sn-In alloy powder.

10. A method of manufacturing a solder-coated printed circuit board, comprising the steps of:
    preparing a printed circuit board body;
    forming a plurality of pads on the board body to form a pad array which has a pitch of not more than 0.5 mm and in which a width of each of said pads at two ends of the pad array is larger than that of a pad located therebetween; and
    forming a solder layer on each of said plurality of pads, the solder layer being formed by a substitution reaction between (a) one of a powder of a metal having the highest ionization tendency among metals constituting the solder layer and a powder of an alloy thereof, and (b) a salt formed by bonding another metal or metals in the solder layer to an organic acid.

11. A solder-coated printed circuit board comprising:
    a printed circuit board body; and
    a plurality of pads formed on a surface portion of the board body and each pad having a solder layer of a thickness necessary for soldering a parts lead, wherein the solder layer is of a type formed by a substitution reaction between (a) one of a powder of a metal having the highest ionization tendency among metals constituting the solder layer and a powder of an alloy thereof, and (b) a salt formed by bonding another metal or metals in the solder layer to an organic acid, wherein the plurality of pads are arranged at a pitch of not more than 0.5 mm to form a pad array, and a width W of each pad and a pad-to-pad distance D satisfy a relation $W > D$.

12. A circuit board according to claim 1, wherein the solder layer contains an Sn-Pb alloy formed by a substitution reaction between a lead salt of an organic acid and a tin powder.

13. A circuit board according to claim 11, wherein the solder layer contains an Sn-Pb-Bi alloy formed by a substitution reaction between a lead salt of an organic acid and an Sn-Bi alloy powder.

14. A circuit board according to claim 11, wherein the solder layer contains an Sn-Pb-In alloy formed by a substitution reaction between a lead salt of an organic acid and an Sn-In alloy powder.

15. A method of manufacturing a solder-coated printed circuit board, comprising the steps of:

preparing a printed circuit board body;

forming a plurality of pads on the board body at a pitch of not more than 0.5 mm such that a width W of each pad and a pad-to-pad distance D satisfy a relation $W > D$; and forming a solder layer on each pad, the solder layer being formed by a substitution reaction between a powder of a metal having the highest ionization tendency among metals constituting the solder layer or a powder of an alloy thereof and a salt formed by bonding an other metal or metals in the solder layer to an organic acid.

* * * * *